United States Patent
Yew et al.

(10) Patent No.: US 7,378,740 B2
(45) Date of Patent: *May 27, 2008

(54) DUAL DAMASCENE STRUCTURE FOR THE WIRING-LINE STRUCTURES OF MULTI-LEVEL INTERCONNECTS IN INTEGRATED CIRCUIT

(75) Inventors: Tri-Rung Yew, Hsinchu (TW); Yimin Huang, Taichung Hsien (TW); Water Lur, Taipei (TW); Shih-Wei Sun, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 49 days.

This patent is subject to a terminal disclaimer.

(21) Appl. No.: 11/196,038

(22) Filed: Aug. 2, 2005

(65) Prior Publication Data
US 2005/0263876 A1 Dec. 1, 2005

Related U.S. Application Data

(60) Division of application No. 10/630,643, filed on Jul. 29, 2003, now abandoned, which is a continuation-in-part of application No. 09/849,391, filed on May 4, 2001, now abandoned, which is a continuation of application No. 09/203,035, filed on Dec. 1, 1998, now Pat. No. 6,265,780.

(51) Int. Cl.
*H01L 23/48* (2006.01)
*H01L 23/52* (2006.01)
*H01L 29/40* (2006.01)

(52) U.S. Cl. .............. 257/758; 257/759; 257/760; 257/E23.145

(58) Field of Classification Search ........ 257/758–760, 257/762, 774–775, E23.145
See application file for complete search history.

(56) References Cited

U.S. PATENT DOCUMENTS

| | | | | |
|---|---|---|---|---|
| 5,679,606 A | * | 10/1997 | Wang et al. | 438/763 |
| 6,245,662 B1 | * | 6/2001 | Naik et al. | 438/622 |
| 6,265,780 B1 | * | 7/2001 | Yew et al. | 257/759 |
| 6,291,334 B1 | * | 9/2001 | Somekh | 438/620 |

* cited by examiner

*Primary Examiner*—Hoai V Pham
(74) *Attorney, Agent, or Firm*—J.C. Patents

(57) ABSTRACT

An improved dual damascene structure is provided for use in the wiring-line structures of multi-level interconnects in integrated circuit. In this dual damascene structure, low-K (low dielectric constant) dielectric materials are used to form both the di-electric layers and the etch-stop layers between the metal interconnects in the IC device. With this feature, the dual damascene structure can prevent high parasite capacitance to occur therein that would otherwise cause large RC delay to the signals being transmitted through the metal interconnects and thus degrade the performance of the IC device. With the dual damascene structure, such parasite capacitance can be reduced, thus assuring the performance of the IC device.

6 Claims, 5 Drawing Sheets

DUAL DAMASCENE STRUCTURE FOR THE WIRING-LINE STRUCTURES OF MULTI-LEVEL INTERCONNECTS IN INTEGRATED CIRCUIT

CROSS-REFERENCE TO RELATED APPLICATION

This application is a divisional application of, and claims the priority benefit of, U.S. application Ser. No. 10/630,643 filed on Jul. 29, 2003 now abandoned, which is a continuation-in-part of a prior application Ser. No. 09/849,391, filed May 4, 2001 now abandoned. The prior application Ser. No. 09/849,391 is a continuation application of Ser. No. 09/203,035 filed on Dec. 1, 1998 a prior application U.S. Pat. No. 6,265,780, issued on Jul. 24, 2001.

BACKGROUND OF THE INVENTION

1. Field of the Invention

This invention relates to a dual damascene structure, and more particularly, to a dual damascene structure for the wiring-line structures of multi-level interconnects in integrated circuit, in which low-K (low dielectric constant) dielectric materials are used to form the dielectric layers and the etch-stop layers between the metal interconnects in the integrated circuit.

2. Description of Related Art

A high-density integrated circuit is typically formed with a multi-level interconnect structure with two or more layers of metal interconnects to serve as wiring line structures for the purpose of electrically interconnecting the various components in the integrated circuit. The multi-level interconnect structure typically includes a first layer (base layer) of metal interconnect structure which is electrically connected to the source/drain regions of the MOS transistors in the integrated circuit, and a second layer of metal interconnect structure which is separated from the base metal interconnect structure by an insulating layer, but with the second metal interconnect structure being electrically connected to the base metal interconnect structure via metal plugs formed in the insulating layer. Still another or more metal interconnect structures can be formed over the second layer of metal interconnect structure.

When the integrated circuit is further scaled down to below deep-submicron level of integration, or the metal interconnects are reduced in resistance to raise the access speed to the IC device, the conventional methods to form the metal interconnects would display some drawbacks. For instance, the etching on the low-resistance copper-based metallization layers to form the metal interconnects would be difficult to carry out on a deep-submicron integrated circuit. Moreover, in the deposition process to form di-electric layers between two neighboring levels of metal interconnects, the resulted di-electric layers would be poor in step coverage that may then cause undesired voids or trapping of impurities to occur. One solution to these problems is to form the so-called dual damascene structure, which can help eliminate the above-mentioned drawbacks of the metal interconnect structures formed in deep-submicron integrated circuits by allowing the dielectric layers between the metal interconnects to be highly planarized. A conventional dual damascene structure is illustratively depicted in the following with reference to FIGS. 1A-1F.

Referring first to FIG. 1A, the dual damascene structure is constructed on a semiconductor substrate 100. A base metal interconnect structure 102 is formed in the substrate 100. Next, a first dielectric layer 104 is formed, typically from silicon dioxide, over the entire top surface of the substrate 100, covering the entire exposed surface of the base metal interconnect structure 102. After this, an etch-stop layer 106 is formed, typically from silicon nitride, over the first dielectric layer 104.

Referring next to FIG. 1B, in the subsequent step, a first photoresist layer 108 is formed over the etch-stop layer 106. The photoresist layer 108 is selectively removed to expose a selected portion of the etch-stop layer 106 that is laid directly above the base metal interconnect structure 102 in the substrate 100. Then, with the photoresist layer 108 serving as mask, an anisotropic dry-etching process is performed on the wafer so as to etch away the unmasked portion of the etch-stop layer 106 until the top surface of the first dielectric layer 104 is exposed. As a result, a contact hole 110 is formed in the etch-stop layer 106, which is located directly above the base metal interconnect structure 102 in the substrate 100.

Referring further to FIG. 1C, in the subsequent step, the entire photoresist layer 108 is removed. After this, a second dielectric layer 112 is formed, typically from silicon dioxide, over the entire top surface of the etch-stop layer 106, which also fills up the entire contact hole 110 in the etch-stop layer 106.

Referring further to FIG. 1D, in the subsequent step, a second photoresist layer 114 is formed over the second dielectric layer 112, which is selectively removed to form a trench 116 and a trench 118 therein. The trench 116 is located directly above the contact hole 110 in the etch-stop layer 106 and formed with a greater width than the contact hole 110.

Referring next to FIG. 1E, with the second photoresist layer 114 serving as mask, a second anisotropic dry-etching process is performed on the wafer to a controlled depth until reaching the etch-stop layer 106 and exposing the top surface of the first di-electric layer 104. This forms a trench 116a and a trench 118a in the second dielectric layer 112.

Referring further to FIG. 1F, in the subsequent step, a third anisotropic dry-etching process is performed on the wafer so as to etch away the part of the first dielectric layer 104 that is laid directly beneath the previously formed contact hole 110 (see FIG. 1B) in the etch-stop layer 106 until the top surface of the base metal interconnect structure 102 is exposed. As a result, a contact hole 120 is formed in the first dielectric layer 104, which is connected to the trench 116a in the second dielectric layer 112.

In the subsequent step, a metal is deposited into the contact hole 120 in the first dielectric layer 104 and the trench 116a and the trench 118a in the second dielectric layer 112 to form a dual damascene structure used to electrically connect the base metal interconnect structure 102 to a higher layer of metal interconnect structure (not shown) that is to be formed over the second dielectric layer 112.

In the foregoing dual damascene structure, the dielectric material(s) used to form the first and second dielectric layers 104, 112 and the dielectric material used to form the etch-stop layer 106 should be selected in such a manner as to allow the etching process to act on them with different etching rates. For instance, in the case of the first and second dielectric layers 104, 112 being formed from silicon dioxide, the etch-stop layer 106 is formed from a high-K dielectric material, such as silicon-oxy-nitride or silicon nitride; whereas in the case of the first and second dielectric layers 104, 112 being formed from a low-K dielectric material, such as fluorosilicate oxide, fluorosilicate glass (FSG), hydrogen silsesquioxane (HSQ), or organics, then the etch-stop layer 106 is formed from a high-K dielectric material, such as silicon dioxide, silicon-oxy-nitride, or silicon nitride.

One drawback to the foregoing dual damascene structure, however, is that the dielectric material used to form the etch-stop layer 106 is much greater in terms of di-electric constant than the dielectric material(s) used to form the first and second dielectric layers 104, 112. For instance, the dielectric constant of silicon nitride is about 7.9. Consequently, when electric currents are conducted through the metal interconnects in the dual damascene structure, a large parasite capacitance would occur in the first and second dielectric layers 104, 112 between the metal interconnects. The presence of this parasite capacitance will then cause an increased RC delay to the signals being transmitted through the metal interconnects, thus degrading the performance of the IC device.

SUMMARY OF THE INVENTION

It is therefore an objective of the present invention to provide an improved dual damascene structure for IC device, in which low-K dielectric materials are used to form both the dielectric layers and the etch-stop layer between the metal interconnects, such that no or at least a reduced parasite capacitance would occur in the dielectric layers, and such that the IC device can be assured in performance without having increased RC delay.

In accordance with the foregoing and other objectives of the present invention, an improved dual damascene structure is provided.

The dual damascene structure of the invention includes a first dielectric layer formed over the substrate from a first low-K dielectric material; an etch-stop layer formed over the first dielectric layer from a low-K inorganic dielectric material; a second dielectric layer formed over the etch-stop layer from a second low-K organic dielectric material; a metal line; and a metal plug. The metal plug is formed in such a manner as to penetrate through the etch-stop layer and the first dielectric layer to come into electrical contact with the base metal interconnect structure in the substrate. The metal line is embedded in the second dielectric layer and connected with the metal plug.

The low-K dielectric materials used to form the first and second dielectric layers and the etch-stop layer can be either inorganic dielectric materials, such as silicon oxide, fluoro-silicate glass (FSG), fluorosilicon oxide, and hydrogen silsesquioxane (HSQ); or organic dielectric materials, such as Flare, SILK, BCB, and Parylene.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A preferred embodiment of the dual damascene structure of the invention is disclosed in the following with reference to FIGS. 2A-2E.

Figure 1A:
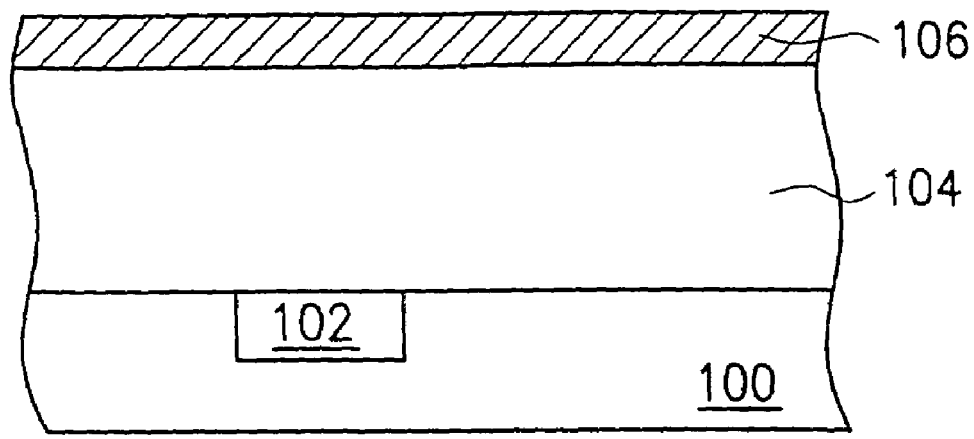
FIGS. 1A-1F are schematic sectional diagrams used to depict the process steps used to fabricate a conventional dual damascene structure.
Figure 1B:
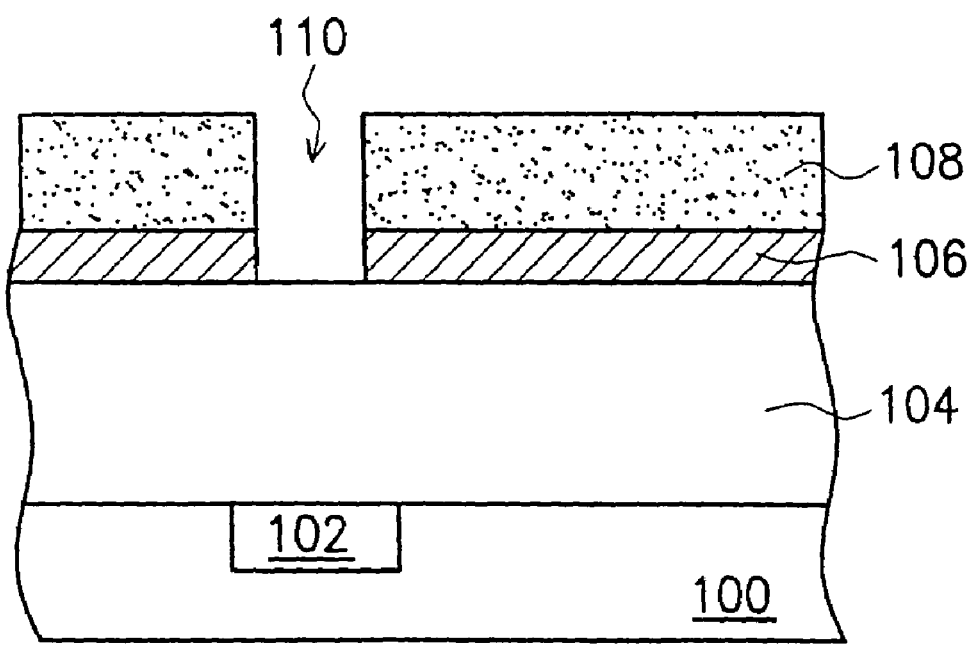
Figure 1C:
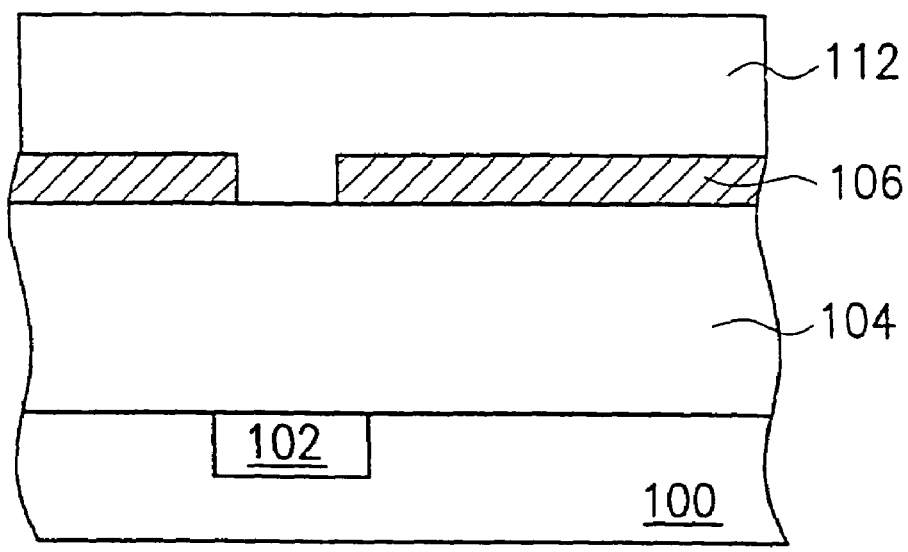
Figure 1D:
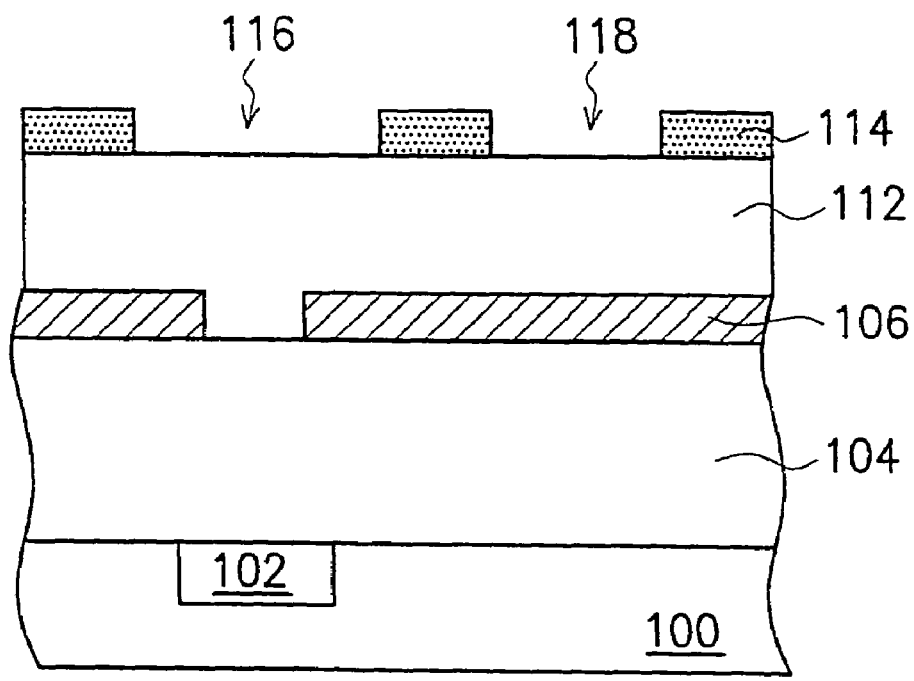
Figure 1E:
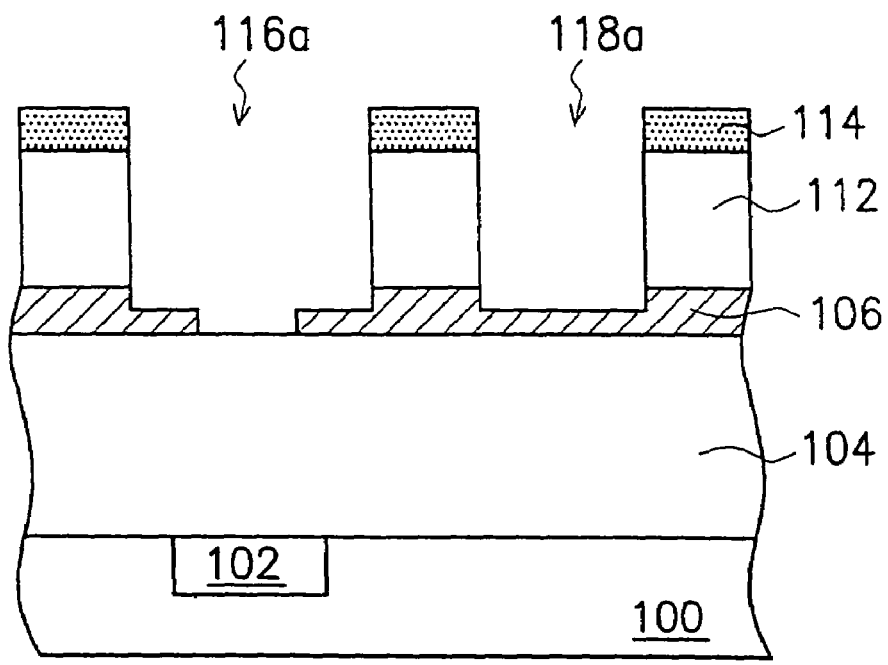
Figure 1F:
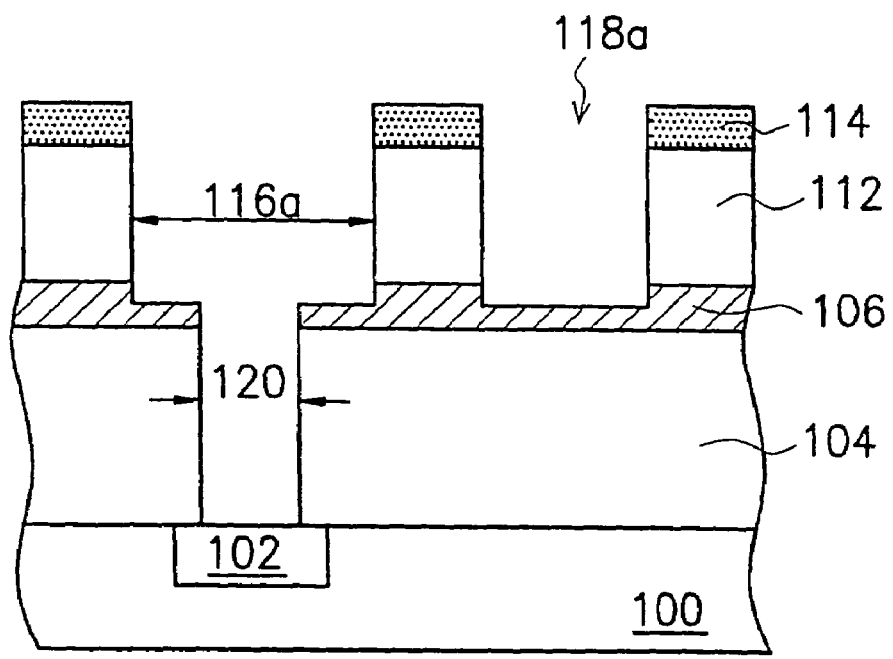
Figure 2A:
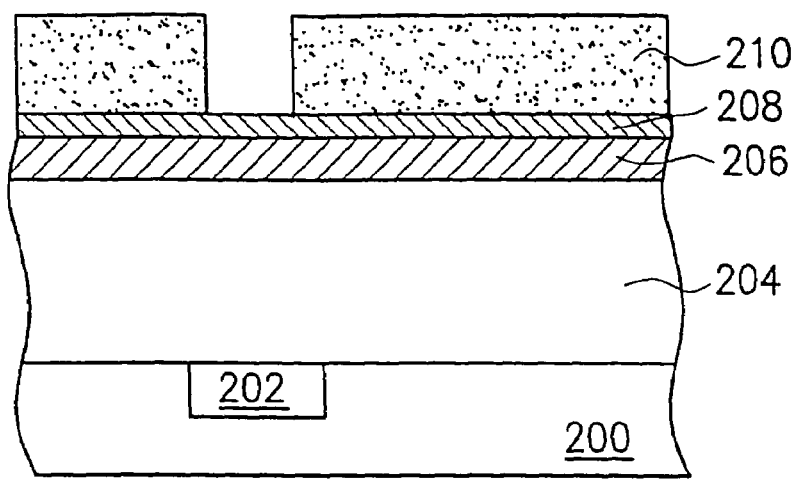
FIGS. 2A-2E are schematic sectional diagrams used to depict the process steps used to fabricate the dual damascene structure of the invention.

Referring first to FIG. 2A, the dual damascene structure is constructed on a semiconductor substrate 200. A base metal interconnect structure 202 is then formed in the substrate 200. Next, a first dielectric layer 204 is formed over the entire top surface of the substrate 200, covering all the exposed surface of the base metal interconnect structure 202. In accordance with the invention, the first dielectric layer 204 is formed from a low-K organic dielectric material, such as Flare, SILK, BCB, or Parylene.

After this, an etch-stop layer 206 is formed over the first dielectric layer 204. In the case of the first dielectric layer 204 being formed from an organic dielectric material, the etch-stop layer 206 is formed a low-K inorganic dielectric material, such as fluoro-silicate glass (FSG), fluorosilicon oxide, or hydrogen silsesquioxane (HSQ). The selected dielectric material to form the etch-stop layer 206 should allow the etch-stop layer 206 to be different in terms of etching rate from the first dielectric layer 204.

Optionally, a protective layer 208 can be formed over the etch-stop layer 206 from a selected dielectric material having a higher dielectric constant than the dielectric material used to form the etch-stop layer 206, such as oxide, silicon-oxy-nitride, or silicon nitride. This protective layer 208 can help prevent the etching rate on the second dielectric layer 212 (to be formed later) to be nearly equal to the etching rate on the etch-stop layer 206 during the subsequently performed etching process, and thus prevent the etch-stop layer 206 from being damaged during the etching process. After the protective layer 208 is formed, the next step is to form a first photoresist layer 210 over the protective layer 208, which is selectively removed to expose a selected area of the protective layer 208 that is laid directly above the base metal interconnect structure 202.

Figure 2B:
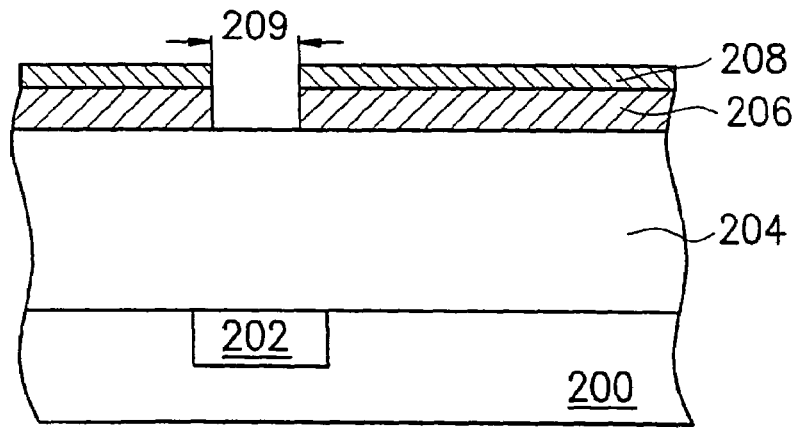

Referring next to FIG. 2B, in the subsequent step, with the first photoresist layer 210 serving as mask, an etching process is performed on the wafer so as to etch away the unmasked portions of the protective layer 208 and the underlying etch-stop layer 206 until the top surface of the first dielectric layer 204 is exposed. This forms a contact hole 209 which penetrate through both the protective layer 208 and the etch-stop layer 206. After this, the entire first photoresist layer 210 is removed.

Figure 2C:
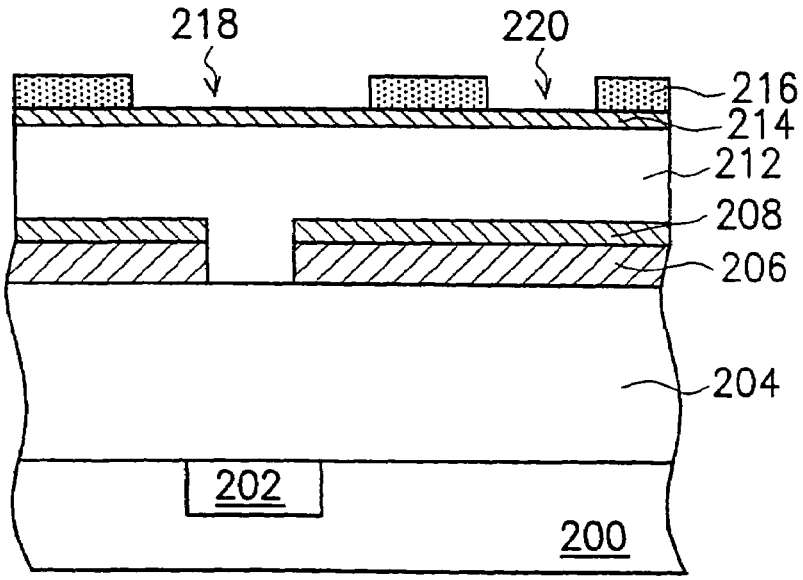

Referring further to FIG. 2C, in the subsequent step, a second dielectric layer 212 is deposited over the entire top surface of the protective layer 208, which also fills up the entire contact hole 209 (see FIG. 2B) in the protective layer 208 and etch-stop layer 206. The second dielectric layer 212 can be formed either from the same dielectric material used to form the first dielectric layer 204, or from a different dielectric material; however, the selected dielectric material should be greater in terms of etching rate than the protective layer 208 and the etch-stop layer 206. Optionally, a hard mask layer 214 can be formed over the second dielectric layer 212 from a high-K inorganic dielectric material, such as silicon oxide, silicon oxy-nitride, or silicon nitride. A second photoresist layer 216 is then formed over the hard mask layer 214. The hard mask layer 214 can help prevent the second dielectric layer 212 from being damaged in the subsequent etching process due to low etching rates on, the first dielectric layer 204 which is made from organic dielectric materials. The second photoresist layer 216 is selectively removed to form a trench 218 and a trench 220. The trench 218 is located directly above the previously formed contact hole 209 (see FIG. 2B) in the protective layer 208 and the etch-stop layer 206, and is formed with a greater width than the contact hole 209.

Figure 2D:
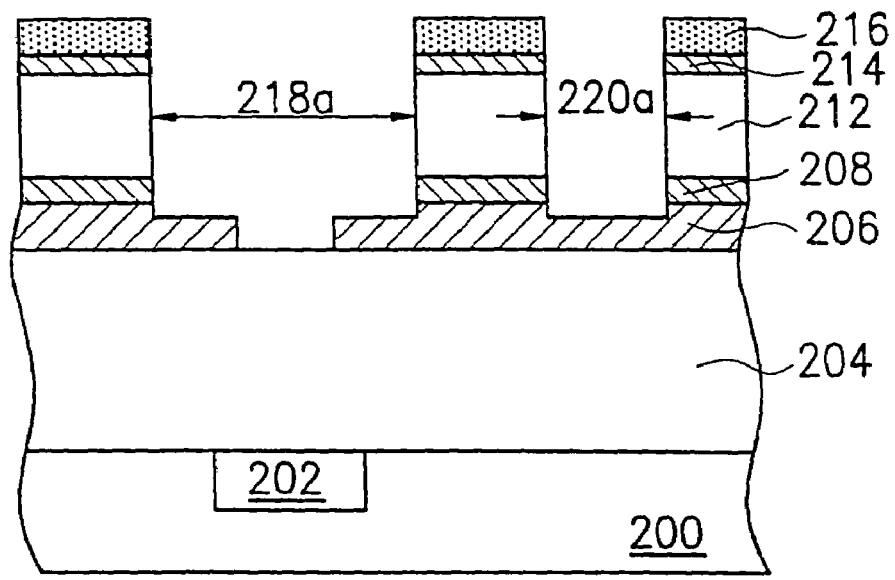

Referring to FIG. 2D, in the subsequent step, with the second photoresist layer 216 serving as mask, a second etching process is performed on the wafer so as to etch away the unmasked portions of the hard mask layer 214, the second dielectric layer 212, and the protective layer 208 until reaching the etch-stop layer 206 and exposing the top surface of the first dielectric layer 204. Through this process, a trench 218a and a trench 220a are formed in such a manner that the trench 218a is located directly above the base metal interconnect structure 202 and exposes the first dielectric layer 204, while the trench 220a does not completely penetrate the etch-stop layer 206.

Figure 2E:
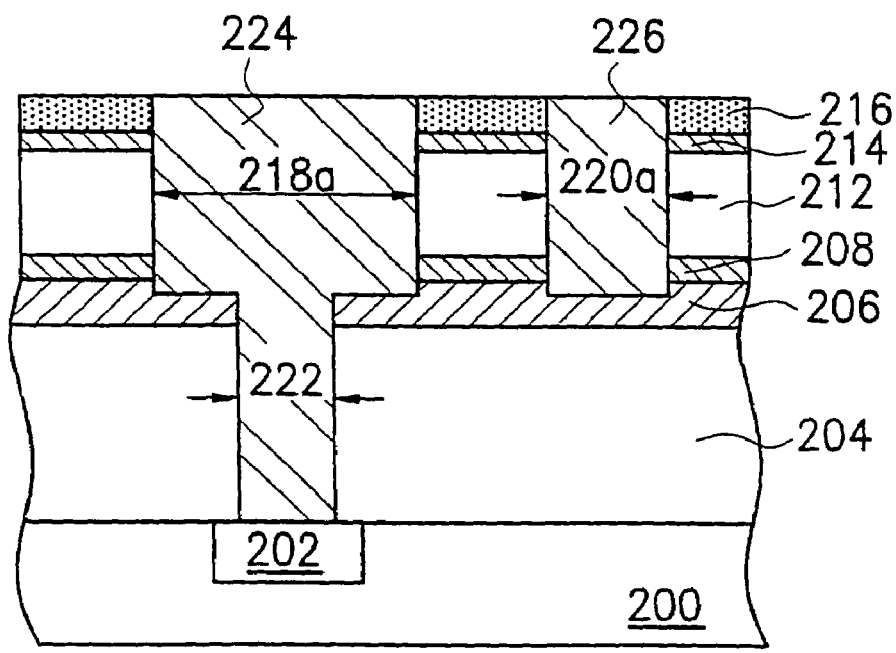

Referring further to FIG. 2E, in the subsequent step, a third etching process is performed on the exposed portion of the first dielectric layer 204 until the top surface of the base metal interconnect structure 202 is exposed. This forms a contact hole 222 in the first dielectric layer 204, which is connected to the trench 218a in the second dielectric layer 212. Then, a conductive layer 224, 226 is formed to fill the bottom contact hole 222, the trench 218a, and the trench 220a. The conductive layer 224 is formed as a metal line in the hard mask 214, the second dielectric layer 212 and the protective layer 208 with a portion extending into the etch-stop layer 206, and a plug penetrating through the etch-stop layer 206 and the first dielectric layer 204 to come into electrical contact with the base metal interconnect structure 202. The conductive layer 226 is formed as a metal line through the hard mask 214, the second dielectric layer 212 and the protective layer 208.

It is a characteristic feature of the invention that the etch-stop layer 206 is formed from a low-K dielectric material instead of a high-K one as in the prior art. In addition to the preferred embodiment described above, various other low-K dielectric materials can be used to form the dielectric layers 204, 212 and the etch-stop layer 206. For example, the dielectric layers 204, 212 can be alternatively formed from low-K inorganic dielectric materials, such as fluorosilicate glass (FSG), fluorosilicon oxide, or hydrogen silsesquioxane (HSQ); while the etch-stop layer 206 can be formed from a low-K organic dielectric material, such as Flare, SILK, or Parylene.

In conclusion, the invention provides an improved dual damascene structure in which low-K dielectric materials are used to form both the dielectric layers and the etch-stop layer in the dual damascene structure. This feature allows a significantly reduced or nearly no parasite capacitance to occur in the dual damascene structure as compared to the prior art. The RC delay caused by the parasite capacitance can therefore be reduced to a lesser degree as compared to the prior art, thus assuring the performance of the IC device.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A dual damascene structure for electrically interconnection to a base metal interconnect structure formed in a semiconductor substrate, which comprises:
    a first dielectric layer formed from a first low-K inorganic dielectric material over the substrate to cover the exposed surface of the base metal interconnect structure;
    an etch-stop layer formed from a low-K organic dielectric material over the first dielectric layer;
    a second dielectric layer formed from a second low-K inorganic dielectric material over the etch-stop layer;
    a protective layer formed between the etch-stop layer and the second dielectric layer, wherein the material of the protective layer is difference from the material of the etch-stop layer;
    a metal line formed in the second dielectric layer and the protective layer; and
    metal plug connected with the metal line and penetrating through the etch-stop layer and the first dielectric layer to come into electrical contact with the base metal interconnect structure in the substrate.

2. The dual damascene structure of claim 1, wherein the organic dielectric material used to form the etch-stop layer selected from a group consisting essentially of Flare, SILK, BCB and Parylene.

3. The dual damascene structure of claim 1, wherein the first and second inorganic dielectric materials used to form the first and second dielectric layers are selected from a group consisting essentially of each fluorosilicate glass (FSG), fluorosilicon oxide, and hydrogen silsesquioxane.

4. The dual damascene structure of claim 1, wherein the protective layer is formed from silicon oxide.

5. The dual damascene structure of claim 1, wherein the protective layer is formed from silicon oxynitride.

6. The dual damascene structure of claim 1, wherein the protective layer is formed from silicon nitride.

* * * * *